US006823027B2

(12) United States Patent
Malmberg et al.

(10) Patent No.: US 6,823,027 B2
(45) Date of Patent: Nov. 23, 2004

(54) METHOD FOR ENHANCING SOFT-VALUE INFORMATION

(75) Inventors: Magnus Malmberg, Sandby (SE); Philip Månsson, Malmö (SE); Roger Persson, Malmö (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 821 days.

(21) Appl. No.: 09/800,414

(22) Filed: Mar. 5, 2001

(65) Prior Publication Data

US 2002/0150180 A1 Oct. 17, 2002

(51) Int. Cl.$^7$ .............................. H04L 27/06; H04D 1/00
(52) U.S. Cl. ...................... 375/341; 375/262; 714/795; 714/796; 714/794
(58) Field of Search .................... 375/265, 262, 375/340, 341; 714/797, 795, 794, 792

(56) References Cited

U.S. PATENT DOCUMENTS

| | | | | |
|---|---|---|---|---|
| 5,307,374 | A | | 4/1994 | Baier ........................... 375/11 |
| 5,781,590 | A | | 7/1998 | Shiokawa et al. .......... 375/341 |
| 5,844,946 | A | * | 12/1998 | Nagayasu .................... 375/341 |
| 5,995,560 | A | * | 11/1999 | Shukhman et al. ......... 375/340 |
| 6,334,202 | B1 | * | 12/2001 | Pielmeier .................... 714/795 |
| 6,484,285 | B1 | * | 11/2002 | Dent ........................... 714/791 |
| 6,487,255 | B1 | * | 11/2002 | Arslan et al. ............... 375/262 |
| 6,690,754 | B1 | * | 2/2004 | Haratsch et al. ............ 375/346 |

FOREIGN PATENT DOCUMENTS

| | | |
|---|---|---|
| EP | 0 606 724 A1 | 7/1994 |
| EP | 0 682 414 A1 | 11/1995 |
| GB | 2 333 014 A | 7/1999 |
| WO | WO 99/41839 | 8/1999 |

OTHER PUBLICATIONS

Spinnler, et al., "Design of Hyper States for Reduced–State Sequence Estimation", AEÜ 1996, vol. 50, No. 1, pp. 1–10.
Eyuboğlu, et al., "Reduced–State Sequence Estimation with Set Partitioning and Decision Feedback", *IEEE Transactions on Communications*, Jan. 1988, vol. 36, No. 1, pp. 13–20.
Månsson, et al., "Equalizer for 8PSK", Master Thesis Jan. 2000, University of Karlskrona/Ronneby.
EPO Search Report, RS 106664 US, Dated: Dec. 11, 2001.

* cited by examiner

*Primary Examiner*—Jean B. Corrielus
(74) *Attorney, Agent, or Firm*—Jenkens & Gilchrist, P.C.

(57) ABSTRACT

A Reduced-State Sequence Estimation (RSSE) method is disclosed, whereby states in a trellis structure associated, for example, with a Viterbi algorithm are partitioned into a plurality of hyper-states. During a hyper-state decision interval, a hyper-soft value is calculated. The calculated hyper-soft value is a measurement of the accuracy of the hyper-state decision made. The calculated hyper-soft value can be used by an equalizer to generate soft-value information for decoding. A soft-value generated from such a hyper-soft value combined with bit soft-value in an RSSE algorithm is significantly more accurate than a soft-value that can be generated for a DFSE algorithm (i.e., without such a hyper-soft value).

21 Claims, 3 Drawing Sheets

METHOD FOR ENHANCING SOFT-VALUE INFORMATION

BACKGROUND OF THE INVENTION

1. Technical Field of the Invention

The present invention relates in general to the digital signal processing field and, in particular, to a method for enhancing soft-value information for a Reduced-State Sequence Estimation (RSSE) type algorithm.

2. Description of Related Art

Maximum Likelihood Sequence Estimation (MLSE) is a known method used in digital receivers to estimate what symbols have been transmitted. However, most MLSE methods are relatively complex to implement. Consequently, RSSE algorithms have been developed which significantly reduce this complexity. As such, RSSE algorithms are now commonly used for receiver estimation and equalization in the digital communications field.

The well-known Viterbi algorithm was originally developed for decoding convolutional codes. The Viterbi algorithm steps through a trellis structure and determines the most probable path (in the Maximum Likelihood sense) through the structure. The most probable path is the one that has the smallest Euclidian distance between reference symbols and received symbols. As such, Viterbi algorithms are commonly used in receiver equalizers to identify the most probable symbols received. Nevertheless, a significant problem with the Viterbi algorithm is that its complexity is often too great for practical implementation, because the algorithm has to step through an entire received signal sequence before any decision can be made. Consequently, as mentioned above, RSSE algorithms were developed in order to reduce the complexity of the Viterbi-type searches being performed.

The nomenclature "Reduced-State Sequence Estimation" is derived from a particular technical approach whereby the trellises associated with a Viterbi search algorithm are constructed with a reduced number of states. Essentially, two methods can be used for reducing the number of states in a Viterbi algorithm: (1) The RSSE method can be used to reduce the number of trellis states for a given search depth in a Viterbi algorithm; and (2) The Decision Feedback Sequence Estimation (DFSE) method (a variant of the RSSE method) can be used to reduce the number of trellis states by reducing the search depth in the Viterbi algorithm.

The Global System for Mobile Communications (GSM) and the Enhanced Data Rates for Global Evolution (EDGE) system are examples of communication systems that can use concatenated coding and decoding for modulation and demodulation. The primary technical goal of the EDGE system, which is currently still under development, is to increase the bit rate of the existing GSM system from 9.6/14.4 kbps up to a maximum of 384 kbps. One way this bit rate increase can be accomplished is to change the modulation technique from Gaussian Minimum Shift Keying (GMSK) to Octary Phase Shift Keying (8PSK). However, a significant problem with changing the modulation technique from GMSK to 8PSK is that the probability of erroneous decisions in the receiver is increased. As far as an equalizer is concerned, the resulting increase in Inter-Symbol Interference (ISI) from the 8PSK modulation, as well as the resulting increase in noise, and also less signal space per symbol, leads to a higher probability that an erroneous receive decision will occur.

The primary task of an equalizer in a digital communication system is to remove the ISI introduced by the channel. The channel's characteristics directly influence the transmitted symbols and can introduce both ISI and noise. The equalizer attempts to estimate the transmitted symbol sequence so that the receiver's demodulator can perform an inverse symbol mapping procedure to obtain the originally transmitted bit sequence.

An equalizer in a GSM or EDGE system can output both hard bits and soft-values to a channel decoder. A soft-value is a measure of the probability that a symbol estimated on the receiver side matches the transmitted symbol. Typically, an equalizer's decisions are made on a symbol-by-symbol basis. However, soft-values represent the probability of a symbol match on a bit-level basis. Furthermore, a channel decoder can use soft-values to correct possibly erroneous symbol decisions made by the equalizer. As such, a channel decoder can use both hard bit and soft-value information to perform the channel decoding.

State-of-the-art RSSE algorithms divide the trellis states of a Viterbi algorithm into a plurality of hyper-states. However, only one symbol from each hyper-state is stored. Given the same number of states, the performance of an RSSE algorithm is usually significantly higher than that of a DFSE algorithm as far as hard bit decisions are concerned. However, a significant problem with the performance of RSSE algorithms (as compared to that of DFSE algorithms) is that the RSSE algorithm's performance is significantly lower for concatenated systems that include soft-values (e.g., GSM and EDGE systems).

In other words, a problem with the state-of-the-art RSSE algorithms is that the soft-values are calculated from information related to the trellis states involved. As such, for trellises used in RSSE algorithms, some states may be missing. Consequently, in a concatenated system using an RSSE algorithm, soft-values can be calculated, but they may be calculated from less than usual information. Therefore, a significant problem with soft-value information derived by the existing RSSE algorithms is that the soft-value information is inherently less accurate in concatenated systems. Nevertheless, as described in detail below, the present invention successfully resolves the above-described problems and other related problems.

SUMMARY OF THE INVENTION

In accordance with a preferred embodiment of the present invention, an RSSE method is provided, whereby states in a trellis structure associated, for example, with a Viterbi algorithm are partitioned into a plurality of hyper-states. During a hyper-state decision interval, a hyper-soft value is calculated. The calculated hyper-soft value is a measurement of the accuracy of the hyper-state decision made. The calculated hyper-soft value can be used by an equalizer to generate soft-value information for decoding. A soft-value generated with such a hyper-soft value combined with bit soft-value in an RSSE algorithm is significantly more accurate than a soft-value that can be generated by a DFSE algorithm (i.e., without such a hyper-soft value).

An important technical advantage of the present invention is that a method is provided for generating more accurate soft-values for an RSSE algorithm.

Another important technical advantage of the present invention is that a method is provided for generating soft-values in an RSSE algorithm, whereby the performance of such an RSSE algorithm is significantly higher than that of a DFSE algorithm.

Yet another important technical advantage of the present invention is that soft-values can be generated that significantly increase the performance of a DFSE algorithm.

BRIEF DESCRIPTION OF THE DRAWINGS

A more complete understanding of the method and apparatus of the present invention may be had by reference to the following detailed description when taken in conjunction with the accompanying drawings wherein.

DETAILED DESCRIPTION OF THE DRAWINGS

The preferred embodiment of the present invention and its advantages are best understood by referring to FIGS. 1–7 of the drawings, like numerals being used for like and corresponding parts of the various drawings.

Essentially, in accordance with a preferred embodiment of the present invention, an RSSE method is provided, whereby states in a trellis structure associated, for example, with a Viterbi algorithm are divided into a plurality of hyper-states. During a hyper-state decision interval, a hyper-soft value is calculated. The calculated hyper-soft value is a measurement of the accuracy of the hyper-state decision made. The hyper-soft value can be used by an equalizer to generate soft-value information for decoding. Soft-value information generated with such a hyper-soft value combined with bi soft-value in an RSSE algorithm is significantly more accurate than soft-value information that can be generated by a DFSE algorithm (i.e., without such a hyper-soft value).

Specifically, in accordance with a preferred embodiment of the present invention, an exemplary RSSE with Set Partition (RSSE-SP) method is described herein for illustrative purposes. Although the RSSE-SP method described herein can be used for estimation and/or equalization in a GSM or EDGE system, the present invention is not intended to be so limited. For example, in accordance with the present invention, the exemplary RSSE-SP method described herein can also be implemented in any appropriate type of digital communication system, or for any appropriate application that can use a reduced-state type of Viterbi or similar algorithm.

In order to be able to use an RSSE-SP method in a concatenated system, an equalizer produces soft-output information as well as hard decision information. A soft output is a measurement of the probability of the hard decision symbol or bit estimated by the equalizer. A hyper-soft value is a measurement value used to add information to the algorithm that generates the soft-values. As such, the hyper-soft method described herein significantly increases the overall performance of a receiver.

Figure 1:
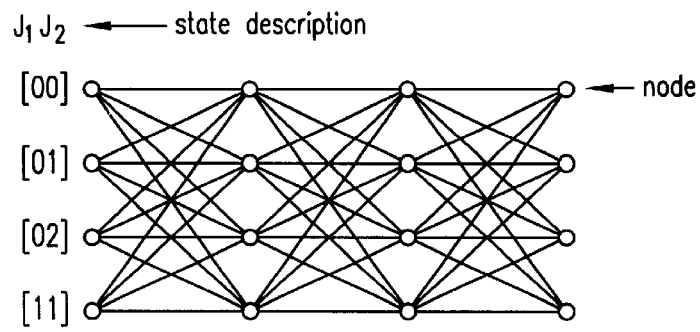
FIG. 1 is a diagram that shows a trellis structure for a Maximum Likelihood Sequence Estimator (MLSE) equalization method.

FIG. 1 is a diagram that shows a trellis structure with four states and four paths into each node. The trellis shown can be traversed by executing a Viterbi algorithm. When an MLSE method is used to traverse the trellis, each node in the trellis structure corresponds to a unique symbol sequence. In the exemplary trellis structure shown in FIG. 1, the state description, $J_1J_2$, corresponds to the input (symbol) sequence.

Figure 2:
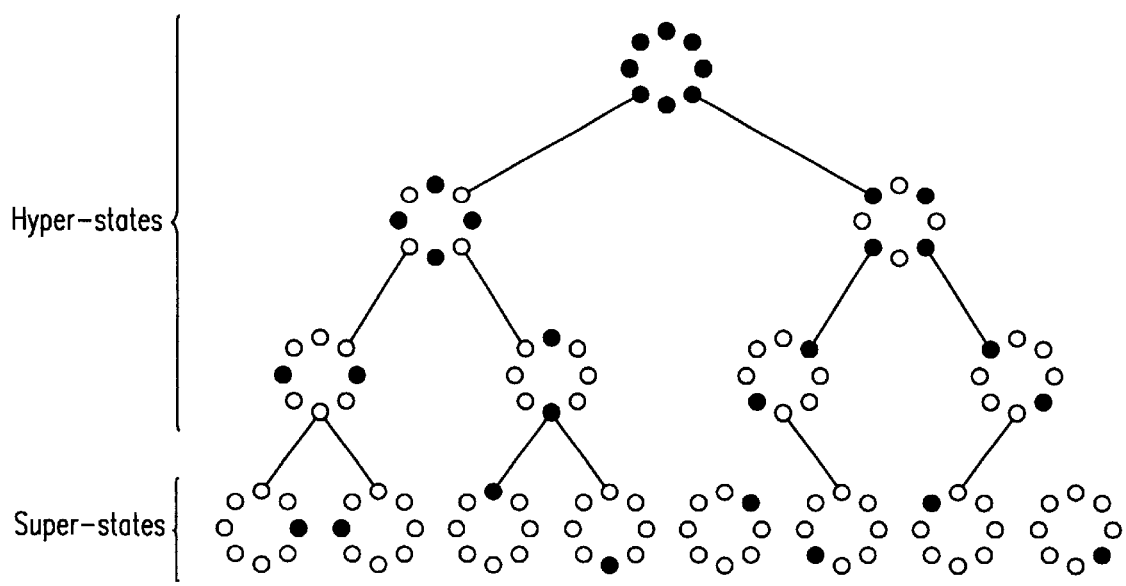
FIG. 2 is a diagram that shows a set partition of a symbol alphabet, in accordance with a preferred embodiment of the present invention.

In accordance with the preferred embodiment of the present invention, when an RSSE-SP method is used for traversing a trellis, a set partition of the transmitted symbol alphabet is made. An example of such a set partition is shown in FIG. 2, which illustrates, in particular, how an 8PSK signal constellation can be partitioned. Once the set partitioning procedure has been completed, the resulting trellis (FIG. 2) is composed of a plurality of states, such as hyper-states and/or super-states. As such, the trellis structure used in conjunction with an RSSE-SP method describes the transitions between hyper-states but not the transitions between symbols. Consequently, the state description derived from an RSSE-SP method corresponds to the hyper-states involved, and not to specific symbols.

As shown in FIG. 2, a hyper-state contains two or more symbols (darkened circles). A super-state contains one symbol. As a consequence of a preferred set partitioning procedure, the Viterbi algorithm is tasked to find the minimum path between hyper-states. In other words, the Viterbi algorithm chooses the path into a hyper-state that has the smallest metric (distance) to one of the symbols contained in that hyper-state. The performance of the RSSE-SP method used depends on how the partitioning of states into hyper-states is accomplished. For example, as described in more detail below, the performance of an RSSE-SP method is improved as the Euclidian distance between symbols in a hyper-state is increased. In this regard, for 8PSK modulation, the use of an Ungerboeck partitioning approach, for example, allows a user to maximize the Euclidian distance between symbols in each hyper-state.

Referring again to FIG. 2, the top-most hyper-state includes eight symbols. This hyper-state configuration can correspond to that of a Decision-Feedback Equalizer (DFE). The eight super-states at the bottom portion of FIG. 2 each includes one symbol. DFSE and MLSE methods can function at this level. Similar to the approach used for DFSE, the RSSE-SP method can be implemented to choose the number of filter taps and identify the states in the trellis. As such, a major difference between the DFSE and RSSE-SP methods is that a specific partitioning-level, $J_k$, can be dedicated for each tap for the RSSE-SP method. In other words, using the RSSE-SP method described herein, it is possible to choose the specific number of symbols that should be included in a hyper-state, for every channel tap. This approach is described in more detail below.

The output signal of the equalizer can be represented as soft-values. As mentioned earlier, soft-values are measurements of the probability that a symbol estimated at the receive side matches a transmitted symbol. Although equalizer decisions are made on a symbol-by-symbol basis, soft-values should represent the probability of a match on a bit-level basis. Moreover, soft-values are used by a channel decoder to correct possible erroneous symbol decisions made by the equalizer. A method that can be used to derive such soft-values is called the simplified Soft Output Viterbi Algorithm (SOVA). This algorithm uses the symbol metrics calculated within a trellis to derive soft-values on a bit-level basis.

If an MLSE or DFSE method is being used for 8PSK modulation, there are eight possible paths into a trellis node. A metric can be calculated for each such path. Each metric can be associated with a specific symbol (i.e., the symbol being shifted out the MLSE unit's memory). The metric difference between the "best" path into a trellis node and the "second best" path into that node is a relatively good measure of the symbol's soft-value.

In using an 8PSK modulation approach, each symbol describes three bits, $b_1,b_2,b_3$. For a simplified SOVA method, the difference between the "best" bits, $b_x=0$ and $b_x=1$, for $x=0,1,2$, of the eight (8PSK) paths is used to derive the soft-value. The result of the soft-value calculation is then stored in a soft-vector, for each state in the trellis. The soft-vector follows the trellis structure in the same way a surviving-sequence follows a trellis structure. In other words, the soft-output signal from the equalizer corresponds to the symbol which is being back-traced in a surviving-vector. The following example illustrates how such a simplified SOVA method can be implemented for the present invention.

Figure 3:
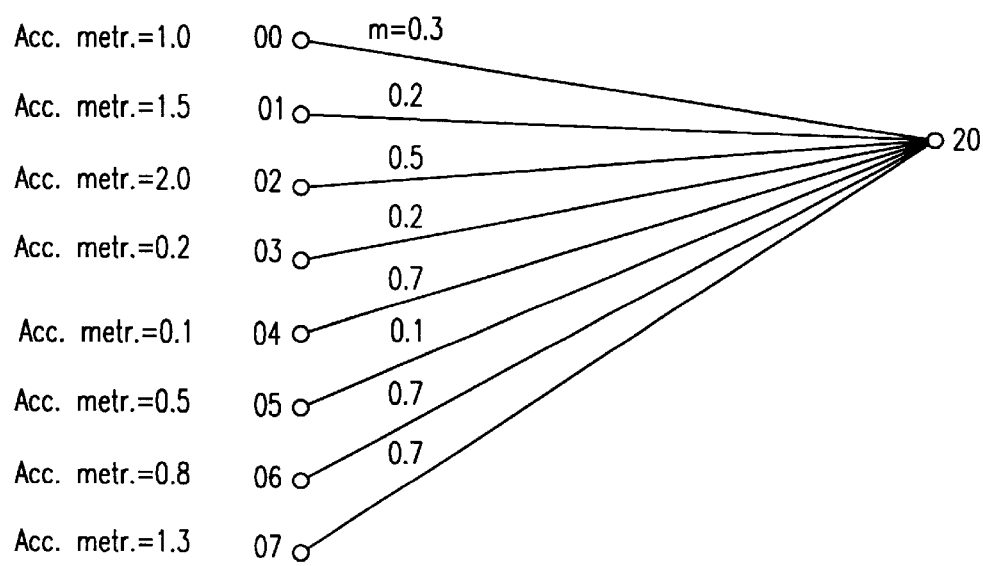
FIG. 3 is a diagram that illustrates how a simplified SOVA method can be implemented for 8PSK, in accordance with the preferred embodiment of the present invention.

FIG. 3 is a diagram that illustrates how a simplified SOVA method can be implemented for 8PSK, in accordance with the preferred embodiment of the present invention. FIG. 3 shows the eight possible branches into the state [2 0]. Each branch has an associated accumulated metric and branch metric, m. The total metric for the eight possible paths shown is:

| | | |
|---|---|---|
| (0) 0 ⇒ $b_2b_1b_0$ = 000 | Acc. Metric = 1.0 + 0.3 = 1.3 |
| (0) 1 ⇒ $b_2b_1b_0$ = 001 | Acc. Metric = 1.5 + 0.2 = 1.7 |
| (0) 2 ⇒ $b_2b_1b_0$ = 010 | Acc. Metric = 2.0 + 0.5 = 2.5 |
| (0) 3 ⇒ $b_2b_1b_0$ = 011 | Aco. Metric = 0.2 + 0.2 = 0.4 |
| (0) 4 ⇒ $b_2b_1b_0$ = 100 | Acc. Metric = 0.1 + 0.7 = 0.8 |
| (0) 5 ⇒ $b_2b_1b_0$ = 101 | Acc. Metric = 0.5 + 0.1 = 0.6 |
| (0) 6 ⇒ $b_2b_1b_0$ = 110 | Acc. Metric = 0.8 + 0.7 = 1.5 |
| (0) 7 ⇒ $b_2b_1b_0$ = 111 | Acc. Metric = 1.3 + 0.7 = 2.0 |

The path from the state [0 3] has the lowest accumulated metric, which implies that the symbol 3 should be stored in the surviving vector of the state [2 0].

Next, the probability of each bit is calculated, and the results of the calculations are stored in the soft-vector. For this exemplary embodiment, the probability of each bit can be calculated as follows:

(1) The best metric for: $b_2=0 \rightarrow 0.4$
   The best metric for: $b_2=1 \rightarrow 0.6$
   Soft-bit-value $b_2=0.6-0.4=0.2$
(2) The best metric for: $b_1=0 \rightarrow 0.6$
   The best metric for: $b_1=1 \rightarrow 0.4$
   Soft-bit-value $b_1=0.4-0.6=-0.2$
(3) The best metric for: $b_0=0 \rightarrow 0.8$
   The best metric for: $b_0=1 \rightarrow 0.4$
   Soft-bit-value $b_0=0.4-0.8=-0.4$ For this exemplary simplified SOVA method, a 1-bit is defined as a negative soft-bit value. As such, the soft-bit values $(b_2b_1b_0)=[0.2\ -0.2\ -0.4]$ correspond to [011], the symbol 3, which in turn corresponds to the symbol being stored in the surviving-vector Notably, the higher the absolute value of the soft-bit, the higher the probability that the associated bit-decision is correct.

Figure 4:
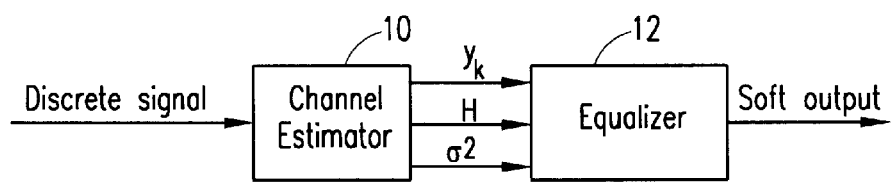
FIG. 4 is a block diagram of an exemplary channel estimator and equalizer that can be used to implement the preferred embodiment of the present invention.

FIG. 4 is a block diagram of an exemplary channel estimator 10 and equalizer 12 that can be used to implement the preferred embodiment of the present invention. In order for an equalizer (e.g., 12) to function properly, a channel estimate should be input to the equalizer. The channel estimator 10 uses the training sequence from the received burst with, for example, a Least Squared (LS) algorithm to derive the channel estimate. For this embodiment, the channel estimation procedure can be performed once for each burst, because this rate is appropriate for slower moving mobile terminals. A so-called channel tracker (not shown) can be used for faster moving mobile terminals, because the channel characteristics may be altered within the period of a burst if a mobile terminal is moving fast enough. Channel trackers are known, and the use of such a device can be for design purposes but should not be considered a limitation on the scope of the present invention.

As shown, a receive signal (burst) including the training sequence is input to the channel estimator 10. Using a known LS algorithm, the channel estimator can calculate and outputs a discrete signal, $y_k$, for each burst, a channel estimate value, H, and a channel noise estimate value, $\sigma^2$. Among other purposes, the noise estimate, $\sigma^2$, can be used for scaling the soft-output of the equalizer 12.

In accordance with the teachings of the present invention, an exemplary RSSE-SP method will now be described. This method can be used, for example, with the channel estimator 10 and equalizer 12 in FIG. 4 to implement the preferred embodiment of the present invention. For this embodiment, an 8PSK modulation technique is used. As such, the Ungerboeck technique of partitioning symbols into hyper-states can be used. This technique is based on the premise that the internal symbols in a hyper-state are located as far from each other as possible. An exemplary 8PSK Ungerboeck partition is shown in FIG. 2.

The partition shown in FIG. 2 can be defined as a two-dimensional vector:

$$\Omega(k)=[J_1,J_2,\ldots,J_K],$$

where the element, $J_k$, corresponds to the number of groups of hyper-states into which the signal alphabet is divided. The partition is limited by the restriction, $J_1 \geq J_2 \geq \ldots \geq J_K$. In other words, the number of symbols included in the hyper-states does not increase while moving backwards in time in the state definition.

Another restriction on the partition is that the vector $\Omega(k)$ is a partition of $\Omega(k+1)$. In other words, the symbols included in $\Omega(k)$ are also included in the partition $\Omega(k+1)$. As such, the number of states, n, in the trellis structure can be calculated as the product:

$$n=J_1 \cdot J_2 \cdot \ldots \cdot J_K.$$

Figure 5A:
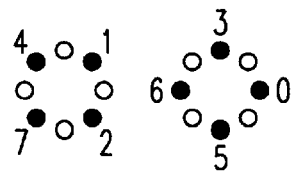
FIGS. 5A and 5B are related diagrams that show the relevant partitions that can be used for an EDGE system-related equalizer, in accordance with the preferred embodiment of the present invention.
Figure 5B:
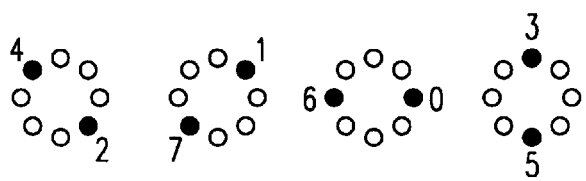

In accordance with the preferred embodiment of the present invention, the relevant partitions that can be used for an EDGE system-related equalizer are shown in FIGS. 5A and 5B. FIG. 5A shows set partitioning that can be used when J=2. FIG. 5B shows set partitioning that can be used when J=4. As illustrated by FIG. 5B, two symbols are mapped into the same hyper-state when $J_K=4$. Notably, the exemplary set partitioning for the embodiment shown in FIGS. 5A and 5B is novel and does not correspond to the set partitioning method(s) described in the EDGE system standard.

Referring to FIGS. 5A and 5B, two of these set partitions are particularly interesting because of the reduction in the number of trellis states involved:

$$\Omega(k)=[4,1,1,1,1,1,1]; \text{ and}$$

$$\Omega(k)=[4,4,2,2,1,1,1]$$

With these different partitioning sets, the number of trellis states can range from a minimum of 4 to a maximum of 64.

Figure 6:
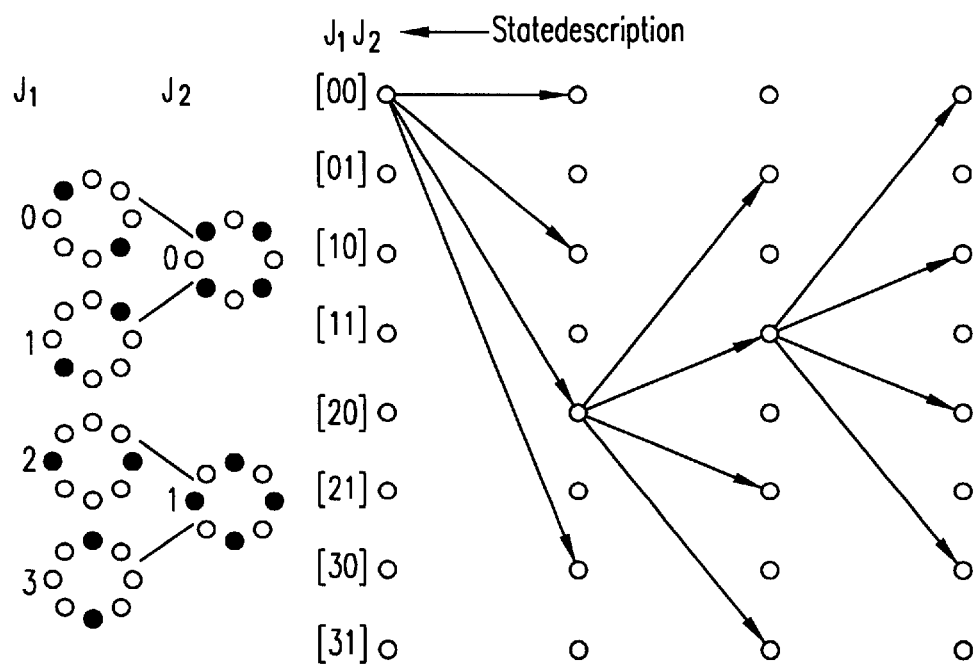
FIG. 6 is a diagram that shows an example of a particular trellis structure that can be generated in accordance with the preferred embodiment of the present invention.

For illustrative purposes, in order to clarify how such a reduced state trellis structure can be traversed, an example of the partitioning of $\Omega(k)=[4,2,1,1,1,1,1]$ is now described. As such, a trellis structure for $\Omega(k)=[4,2,1,1,1,1,1]$ is generated as shown in FIG. 6. For clarity, some of the less pertinent transitions are not shown.

Notably, the state description in an RSSE-SP does not provide explicit information about previous symbols, because there is no direct mapping between states and symbols. For example, referring to FIG. 6, but using the mapping scheme illustrated above with respect to FIGS. 5A and 5B, the information conveyed in the state description [21] is that "2" corresponds to either of the symbols 0 or 6, and "1" corresponds to any of the symbols 0, 3, 5 or 6. The metric is derived by calculating the accumulated metric for every symbol included in the hyper-state. The path with the "best" metric is then stored, and the other metrics thus calculated are discarded. The most probable symbol within the hyper-state is then added to the stored path of the "best" metric. As such, a hard symbol decision is actually made in the hyper-state involved.

The partitioning of the competing symbols within the hyper-state is performed as described above. Since it is very important that the correct symbol be selected, the internal symbols in the hyper-state are located as far away from each other as possible. The symbol which is located at the nearest Euclidian distance is stored, and the other symbols are discarded. The number of states can be the same for two different partitions. However, the trellis structures can be different even if the number of states is the same.

For example, referring to FIG. 6, the partition [4 4] does not generate the same trellis structure as the partition [4 2 2]. Compared to that of an MLSE approach, the partition [4 2 2] is reduced more than the partition [4 4] with the same number of taps in its state description. Also, the partition [4 2 2] advantageously utilizes energy for symbol decisions from further back in the channel impulse response, but stores fewer surviving paths.

The primary purpose of an equalizer is to minimize the effects of ISI. This function is typically accomplished by taking the previously received symbols into consideration while estimating what symbol was most likely transmitted. The receiver component that follows an equalizer is typically a decoder. The decoder corrects erroneous bit decisions using redundancy introduced by the encoder at the transmitter. The decoder performs at its best when soft decision information is provided as an input. As mentioned earlier, a soft decision is a measurement of the probability that a symbol was estimated correctly. On the other hand, a hard decision indicates which bit/symbol an equalizer has determined to be the most probable.

In this regard, when a trellis is traversed in accordance with an RSSE-SP algorithm (e.g., implemented by an equalizer), not only do the different paths leading into a node compete with each other, but the internal symbols within a hyper-state are also competing with each other. The symbol with the minimum Euclidian distance to the received symbol is stored in a surviving sequence. The surviving sequence thus contains information about the most probable path through the trellis.

The function of storing the symbol with the minimum Euclidian distance to the received symbol can be considered a hard decision, within a hyper-state. However, if the "second best" symbol is nearly the same Euclidian distance to the received symbol as the "best" symbol, a hard decision made on that basis may not be very reliable. As such, in accordance with the preferred embodiment of the present invention, a primary goal of the hyper-soft method described herein is to produce probability information about the hard decision. In that regard, a hyper-soft value is defined as the difference between the "best" and "second best" competing symbols within a hyper-state. FIG. 3 is a diagram which illustrates that definition and difference.

Referring to FIG. 3, a received symbol, $S_k$, is shown. The parameters, $m_1$ and $m_2$, represent respective distances from the received symbol, $S_k$, and the symbols 0 and 1 within a hyper-state. As applied with respect to the geometry shown in FIG. 3, the definition of the hyper-soft, $\Psi$, is:

$$\Psi = f_k(m_1, m_2, \ldots, m_k),$$

where $f_k$ is a function that makes the hyper-soft more general. An example of a hyper-soft is:

$$\Psi = |m_1 - m_2|.$$

As such, as the value of the hyper-soft, $\Psi$, increases, the reliability of the decision associated with this hyper-soft also increases. This hyper-soft information can be used by an existing soft-value generation algorithm to produce a more accurate soft-value output. The specific manner in which the hyper-soft information is used depends primarily on the overall soft-value generation algorithm used. In accordance with the preferred embodiment of the present invention, the use of such a hyper-soft method makes it possible to better utilize the information from a decision about the most probable symbol within a hyper-state, in an equalizer method using, in particular, RSSE-SP. This information can be used advantageously in a concatenated system (e.g., GSM, EDGE, etc.) to produce a more accurate soft output.

Figure 7:
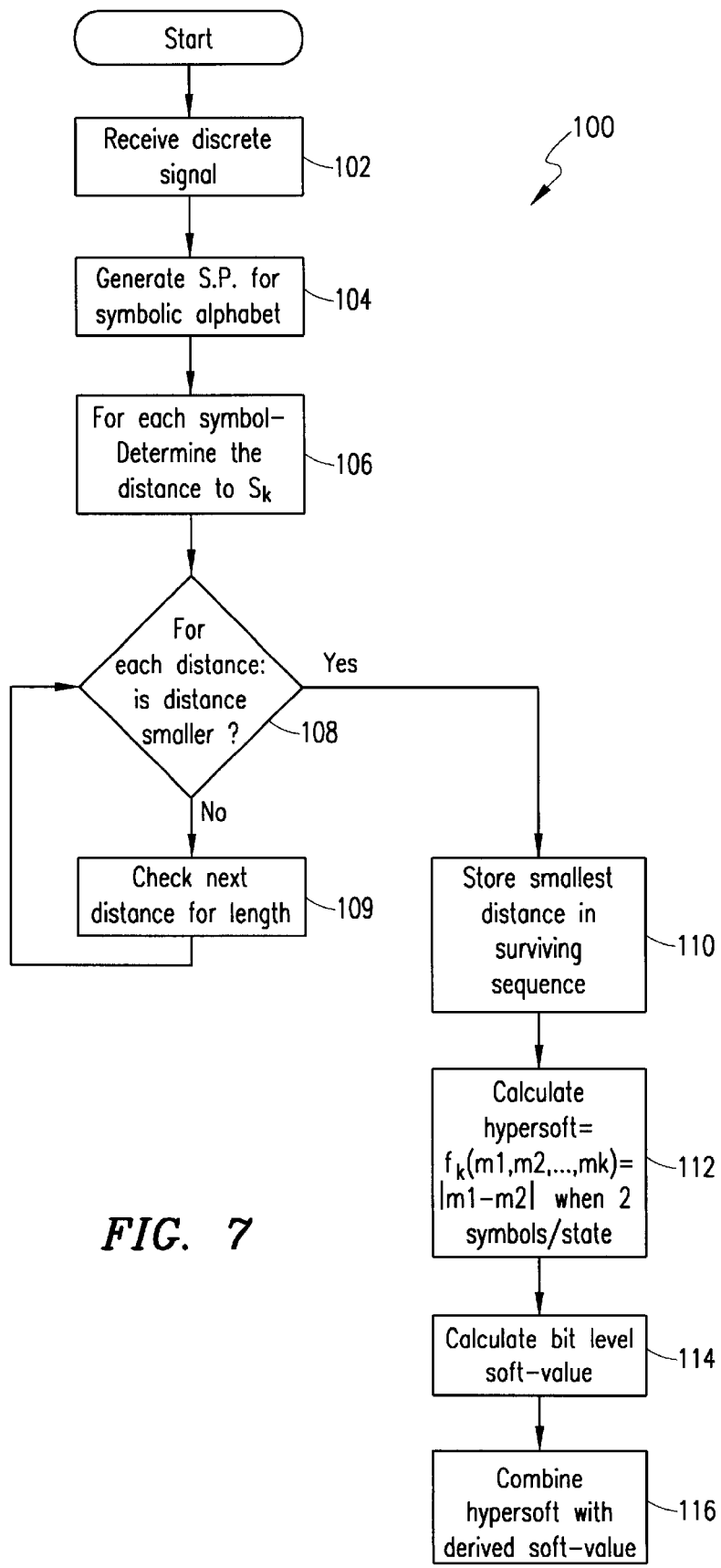
FIG. 7 is a flow chart of an exemplary method that summarizes the more pertinent steps that can be followed to generate soft-value information, in accordance with the preferred embodiment of the present invention.

FIG. 7 is a flow chart of an exemplary method 100 that summarizes the more pertinent steps that can be followed to generate soft-value information, in accordance with the preferred embodiment of the present invention. For this embodiment, the steps can be performed by a processor in an equalizer, such as, for example, the equalizer 12 shown in FIG. 4.

Referring to FIG. 7, at step 102 of the method 100, the equalizer 12 receives a discrete signal, $Y_k$, from the channel estimator 10. The equalizer 12 extracts a symbol, $S_k$, from the received discrete signal, $Y_k$. At step 104, the equalizer 12 generates a set partition for the symbol alphabet. For this exemplary embodiment, and for 8PSK modulation, an Ungerboeck set partitioning method can be used. At step 106, for each symbol thus derived, the equalizer determines the Euclidian distance to the received symbol, $S_k$. At step 108, the equalizer then determines which of those symbols has the minimum Euclidian distance to the received symbol. At step 110, the equalizer 12 stores (in local memory) the symbol information for the symbol that has the minimum Euclidian distance to the received symbol. This symbol information is stored in a surviving sequence, which contains the most probable path through the trellis involved. At step 112, the equalizer 12 calculates hyper-soft information from the expression, $\Psi = f_k(m_1, m_2, \ldots, m_k)$. For example, using two symbols per state, the expression $\Psi = |m_1 - m_2|$, can be used to generate hyper-soft information from the "best" and "second best" competing symbols within the hyper-state (s) involved. In other words, for this exemplary embodiment, a processor in the equalizer can calculate the difference between the "best" symbol metric and the "second best" symbol metric. The hyper-soft value thus derived is the absolute value of this difference.

At step 114, the equalizer 12 calculates a bit level soft-value. At step 116, the equalizer 12 combines the hyper-soft value calculated at step 112 with the soft-value derived at step 114. The resulting combined soft-value information can be output from the equalizer for use by a decoder. In a concatenated system such as the GSM or EDGE, the hyper-soft information thus derived can be used to produce a significantly more accurate soft output than existing approaches can produce.

Although a preferred embodiment of the method and apparatus of the present invention has been illustrated in the accompanying Drawings and described in the foregoing Detailed Description, it will be understood that the invention is not limited to the embodiment disclosed, but is capable of numerous rearrangements, modifications and substitutions without departing from the spirit of the invention as set forth and defined by the following claims.

What is claimed is:

1. A method for generating soft-value information for a communication system, comprising the steps of:
    receiving a first communication symbol;
    creating a set partition for a plurality of second communication symbols;
    for each one of said plurality of second communication symbols, determining a metric value associated with said first communication symbol;
    storing information associated with a minimum value of said plurality of determined metric values;
    determining a best symbol value and second best symbol value from said stored information; and
    calculating a difference between said best symbol value and said second best symbol value.

2. The method of claim 1, wherein the creating step is performed with an Ungerboeck partitioning method.

3. The method of claim 1, wherein said set partition comprises a plurality of hyper-states.

4. The method of claim 1, wherein said set partition comprises a set partition for 8PSK modulation.

5. The method of claim 1, wherein said set partition comprises a set partition for MPSK modulation, where M is a positive integer.

6. The method of claim 1, wherein the steps are performed by an equalizer.

7. The method of claim 1, wherein said difference between said best symbol value and said second best symbol value comprises a hyper-soft value.

8. The method of claim 1, wherein said difference between said best symbol value and a $k^{th}$ best symbol value is further defined as a hyper-soft value, $\Psi = f_k(m_1, m_2, \ldots, m_k)$;
    wherein $f_k$ is a function generalizing said hyper-soft value; and
    wherein $m_k$ comprises a metric associated with a $k^{th}$ best symbol value.

9. The method of claim 8, wherein said difference between said best symbol value and said second best symbol value is further defined as a hyper-soft value, $\Psi = |m_1 - m_2|$, where $m_1$ comprises a metric associated with said best symbol value, and $m_2$ comprises a metric associated with said second best symbol value.

10. The method of claim 1, wherein said communication system comprises a GSM.

11. The method of claim 1, wherein said communication system comprises an Enhanced Data Rates for Global Evolution (EDGE) system.

12. A system for generating soft-value information for use in a communication network, comprising:
    a channel estimator operable to:
    receive a discrete signal; and
    generate at least one of a channel estimate and a noise estimate; and
    an equalizer coupled to an output of said channel estimator, said equalizer operable to:
    receive a first communication symbol associated with said discrete signal;
    create a set partition for a plurality of second communication symbols;
    determine a metric value associated with said first communication symbol for each one of said plurality of second communication symbols;
    store information associated with a minimum value of said plurality of determined metric values;
    determine a best symbol value and second best symbol value from said stored information; and
    calculate a difference between said best symbol value and said second best symbol value.

13. The system of claim 12, wherein said equalizer is further operable to create said set partition for said plurality of second communication symbols with an Ungerboeck partitioning method.

14. The system of claim 12, wherein said set partition comprises a plurality of hyper-states.

15. The system of claim 12, wherein said set partition comprises a set partition for 8PSK modulation.

16. The system of claim 12, wherein said set partition comprises a set partition for MPSK modulation, where M is a positive integer.

17. The system of claim 12, wherein said difference between said best symbol value and said second best symbol value comprises a hyper-soft value.

18. The system of claim 12, wherein said difference between said best symbol value and a $k^{th}$ best symbol value is further defined by a hyper-soft value, $\Psi = f_k(m_1, m_2, \ldots, m_k)$.
    wherein $f_k$ is a function generalizing said hyper-soft value; and
    wherein $m_k$ comprises a metric associated with a $k^{th}$ best symbol value.

19. The system of claim 18, wherein said difference between said best symbol value and said second best symbol value is further defined as a hyper-soft value, $\Psi = |m_1 - m_2|$, where $m_1$ comprises a metric associated with said best symbol value, and $m_2$ comprises a metric associated with said second best symbol value.

20. The system of claim 12, wherein said communication network comprises a GSM network.

21. The system of claim 12, wherein said communication network comprises an Enhanced Data Rates for global Evolution (EDGE) network.

* * * * *